United States Patent
Blanc

(10) Patent No.: US 8,305,132 B2
(45) Date of Patent: Nov. 6, 2012

(54) LOW-PASS FILTER WITH ADJUSTABLE CUT-OFF FREQUENCY

(75) Inventor: Jean-Pierre Blanc, Theys (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 13/089,185

(22) Filed: Apr. 18, 2011

(65) Prior Publication Data

US 2011/0279196 A1 Nov. 17, 2011

(30) Foreign Application Priority Data

Apr. 20, 2010 (FR) ...................................... 10 53023

(51) Int. Cl.
*H03K 5/00* (2006.01)
(52) U.S. Cl. .......................... 327/337; 327/558; 327/552
(58) Field of Classification Search .......... 327/551–559, 327/336–337
See application file for complete search history.

(56) References Cited

U.S. PATENT DOCUMENTS

| | | | | |
|---|---|---|---|---|
| 5,540,951 | A | * | 7/1996 | Nagayama et al. ......... 427/372.2 |
| 5,686,861 | A | * | 11/1997 | Shou et al. .................... 327/552 |
| 6,061,009 | A | * | 5/2000 | Krone et al. ................... 341/143 |
| 6,268,765 | B1 | * | 7/2001 | Gopinathan et al. .......... 327/553 |
| 8,120,417 | B2 | * | 2/2012 | Kannan et al. ................ 327/552 |

OTHER PUBLICATIONS

Castor-Perry, Kendall, *Wiley Engyclopedia of Electrical and Electronics Engineering*, John Wiley & Sons Inc., 1999, "Programmable Filters," pp. 1-22.

* cited by examiner

*Primary Examiner* — Dinh T. Le
(74) *Attorney, Agent, or Firm* — Seed IP Law Group PLLC

(57) ABSTRACT

A low-pass filter includes an integrator having an adjustable unity frequency. The integrator includes a first input, first output and feedback loop between the first input and output of the integrator. The first input is connected to a branch that includes a first impedance, to which is applied a first input voltage of the low-pass filter. The feedback loop includes a second impedance and the first output of the integrator is the first output of the low-pass filter.

17 Claims, 3 Drawing Sheets

LOW-PASS FILTER WITH ADJUSTABLE CUT-OFF FREQUENCY

BACKGROUND

1. Technical Field

The disclosure relates to a low-pass filter, comprising an integrator whose unity frequency is adjustable.

2. Description of the Related Art

Low-pass filters are elements that are used in numerous applications, in particular in signal processing subsystems.

The applications that use low-pass filters include the telecommunication reception subsystems, regardless of the standard used, of GSM (Global System for Mobile Communications), W-CDMA (Wideband Code Division Multiple Access), WIFI (Wireless Fidelity) or even WiMax (Worldwide Interoperability for Microwave Access) type, or else also the filtering subsystems used to filter the data read by the hard disk read heads.

Given the increasingly large number of possible applications and the proliferation of the standards, it is desirable for the signal processing subsystems not only to exhibit a significant linearity but also to be able to operate over wide frequency ranges.

In the case of a GSM reception subsystem, the cut-off frequency for the entire reception subsystem is well determined. However, in practice, the cut-off frequency of a GSM reception subsystem can vary within a ratio of 1 to 2 about the mean cut-off frequency. Thus, there is a need for a reception subsystem with a cut-off frequency that can be adjusted according to the variations of the cut-off frequency.

There is also a need for reception subsystems to be reconfigurable. As an example, a reception subsystem initially configured for the GSM standard may be reconfigured for the W-CDMA standard. The cut-off frequency of the low-pass filters that form such reception subsystems should be able to be adapted according to the standard for which the subsystem is reconfigured. In practice, the cut-off frequencies of the various standards may be very different, within a ratio that can range in practice from 1 to 5, or even from 1 to 10.

The read signals from the hard disk read heads also exhibit wide cut-off frequency variations. In fact, in practice, since these frequency variations are linked to the rotation variations of the hard disk and of the position of the read head, they can vary within a ratio from 1 to 20 or even from 1 to 25.

There is therefore a need for reception subsystems that are adjustable or that can be adjusted in order to be able to be used for different applications.

In the prior art, there are low-pass filters of the "GmC" filter type, and low-pass filters of the "active RC" type.

One example of low-pass filter of the first order of the "GmC" filter type 10 is represented in FIG. 1.

The low-pass filter 10 represented in FIG. 1 comprises two types of components, first 12 and second 16 transconductors and a capacitor 14.

The inverting input of the first transconductor 12 is linked to ground. The non-inverting input of this first transconductor 12 is connected to a branch to which is applied the input voltage $V_{in}$ of the low-pass filter 10. The output of the first transconductor 12 is connected to the inverting input of the second transconductor 16. Said branch linking the output of the first transconductor 12 and the inverting input of the second transconductor 16 is linked to ground via the capacitor 14. The non-inverting input of the second transconductor 16 is linked to ground. The second transconductor 16 comprises a feedback loop between its output and its inverting input. The output voltage $V_{out}$ of the low-pass filter 10 is measured at the output of the second transconductor 16.

In the case of the first order filter as represented in FIG. 1, the cut-off frequency fc of the filter can be expressed:

$$fc = \frac{gm}{2\pi C},$$

with gin being the conductance of the transconductors and C being the value of the capacitor 14.

The benefit of such a "GmC" filter lies in the fact that the cut-off frequency can be adjusted by varying the conductance "gin". Numerous variants of "GmC"-type first order low-pass filters are known to those skilled in the art.

However, such low-pass filters exhibit the drawback of having their linearity depend directly on the linearity of the transconductors 12 and 16. The linearity of the transconductors 12 and 16 cannot easily be improved with the usual techniques.

One example of "active RC"-type first order low-pass filters is represented in FIG. 2.

The low-pass filter 18 represented in FIG. 2 comprises an operational amplifier 20, first 22 and second 24 resistors and a capacitor 26.

Said operational amplifier 20 comprises first and second inputs, an output and a feedback loop between said output and said first input. Said first input is connected to a branch comprising the first resistance 22 to which is applied the input voltage $V_{in}$ of the low-pass filter 18.

The feedback loop comprises the second resistor 24 mounted in parallel with the capacitor 26. The second input of the operational amplifier 20 is linked to ground.

The output voltage $V_{out}$ of the low-pass filter 18 is measured at the output of the operational amplifier 20.

The low-pass filter 18 represented in FIG. 2 is a first-order filter, the cut-off frequency fc of said low-pass filter 18 is expressed:

$$fc = \frac{1}{2\pi R_2 C},$$

with $R_2$ being the value of the second resistor 24 and C being the value of the capacitor 14.

The benefit of such an "active RC" filter is its very good linearity performance. In practice, the high gain of the operational amplifier 20 makes it possible to have a voltage $\epsilon$ between the inputs of the operational amplifier 20 that is very low, ideally zero. The input current of the operational amplifier 20 is also zero, so the output voltage Vout of the low-pass filter 18 will be primarily determined by the first and second resistors 22, 24 and the capacitor 26. Since these components are highly linear, the linearity performance characteristics of an "active RC" low-pass filter are very good.

The drawback with this type of low-pass filter lies in the fact that the cut-off frequency cannot be adjusted other than by modifying the value of the capacitor 16, which is done discretely by connecting or disconnecting other capacitors in parallel with the initial capacitor. This adjustment method increases the complexity of the assembly since it uses multiple additional capacitors and switches to be put in place.

BRIEF SUMMARY

One embodiment is a first order low-pass filter that offers both good linearity performance characteristics and the possibility of easily adjusting its cut-off frequency.

The disclosure thus proposes a low-pass filter, comprising an integrator whose unity frequency $f_u$ is adjustable, said integrator comprising at least one first input, at least one first output and a feedback loop between said first input and output of said integrator, wherein said first input being connected to a branch comprising a first impedance $Z_1$ to which is applied a first input voltage $V_{e1}$ of the low-pass filter, said feedback loop comprising a second impedance $Z_2$, said first output of said integrator also being a first output of the low-pass filter.

Advantageously, such a low-pass filter exhibits very good linearity performance and an adjustable cut-off frequency fc.

In practice, the feedback loop ensures good linearity performance of such a low-pass filter and the integrator whose unity frequency is adjustable makes it possible to adjust the cut-off frequency of such a low-pass filter.

A low-pass filter according to the disclosure may also include one or more of the optional characteristics below considered individually or in all possible combinations:

the integrator whose unity frequency $f_u$ is adjustable, comprises a variable gain control stage between an input stage comprising a transconductor and an output stage;

the variable gain control stage of the integrator whose unity frequency $f_u$ is adjustable is configured to allow the unity frequency $f_u$ of said integrator to be adjusted;

the gain α of the variable gain control stage varies from a value $\alpha_{min}$ to a value $\alpha_{max}$, with $1 \leq \alpha_{max}/\alpha_{min} \leq 25$;

the integrator whose unity frequency $f_u$ is adjustable comprises a second input and a second output, said second input and output being connected to ground;

the integrator whose unity frequency is adjustable comprises a second input and a second output, a second feedback loop between said second input and output of said integrator, wherein said second input being connected to a second branch comprising a third impedance to which is applied a second input voltage $V_{e2}$ of the low-pass filter, said second feedback loop comprising a fourth impedance, said second output of said integrator also being a second output of the low-pass filter;

the first and second impedances are chosen such that $0.5 \leq Z_2/Z_1 \leq 5$, preferably $0.5 \leq Z_2/Z_1 \leq 2$, with $Z_1$ and $Z_2$ being the values of the first and second impedances;

the third and fourth impedances are chosen such that $0.5 \leq Z_4/Z_3 \leq 5$, preferably $0.5 \leq Z_4/Z_3 \leq 2$, with $Z_3$ and $Z_4$ being the values of the third and fourth impedances.

Another subject of the disclosure is a low-pass filter of an order greater than or equal to two comprising at least one first order low-pass filter according to the disclosure.

The disclosure also relates to a low-pass filter of an order greater than or equal to two that has a leapfrog cascade structure comprising at least one first order low-pass filter according to the disclosure.

Another subject of the disclosure is a subsystem for processing at least one electrical signal comprising at least one low-pass filter according to the disclosure.

BRIEF DESCRIPTION OF THE SEVERAL VIEWS OF THE DRAWINGS

The disclosure will be better understood from reading the following description, given solely as an example and with reference to the appended diagrammatic drawings in which.

DETAILED DESCRIPTION

Within the meaning of the disclosure, the term "integrator" should be understood to mean a device for which the output signal, for example a current or voltage signal, is substantially proportional to a primitive of the signal applied to the input.

Within the meaning of the disclosure, the term "unity frequency" of an integrator should be understood to mean the frequency for which the modulus of the transfer function of the integrator is equal to 1, or else the gain of said integrator is equal to 0 dB.

Figure 1:
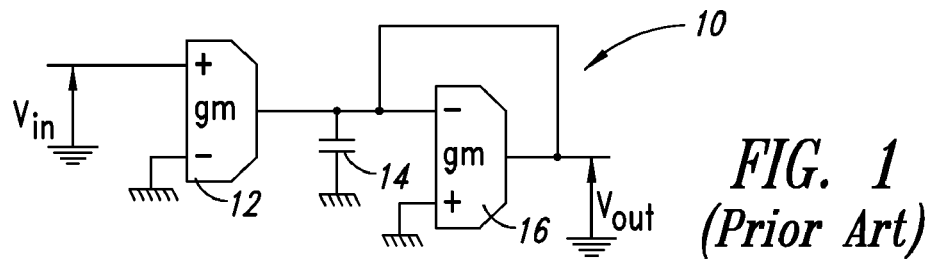
FIG. 1 represents a first order low-pass filter of the "GmC" type.
Figure 2:
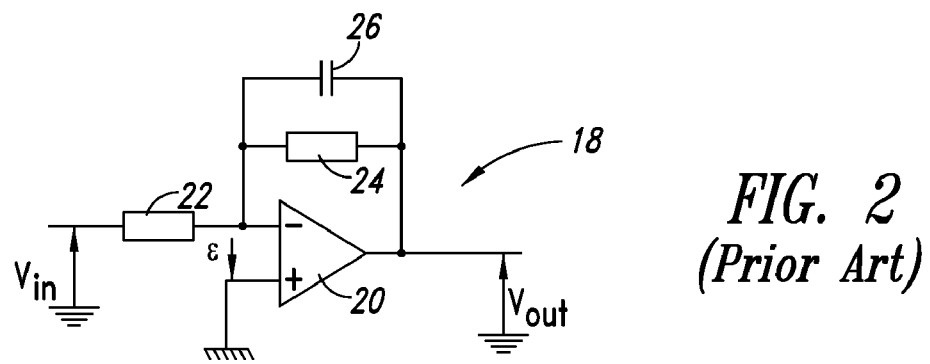
FIG. 2 represents a first order low-pass filter of the "active RC" type.

FIGS. 1 and 2 have been described previously.

Figure 3:
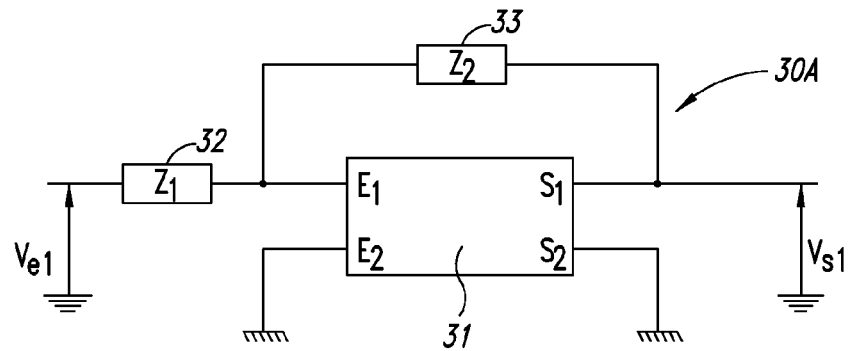
FIG. 3 represents a low-pass filter according to a first embodiment of the disclosure.

FIG. 3 represents a first order low-pass filter according to a first embodiment of the disclosure. The low-pass filter 30A represented in FIG. 3 comprises an integrator 31 whose unity frequency $f_u$ is adjustable and first 32 and second 33 impedances.

Said integrator 31 comprises first $E_1$ and second $E_2$ inputs, first $S_1$ and second $S_2$ outputs and a feedback loop between the first output $S_1$ and the first input $E_1$.

The second input $E_2$ and output $S_2$ of the integrator 31 are connected to ground.

The first input $E_1$ of the integrator 31 is connected to a branch comprising the first impedance 32, denoted $Z_1$, to which is applied an input voltage $V_{e1}$ of the low-pass filter 30A. The feedback loop comprises the second impedance 33, denoted $Z_2$. The output voltage $V_{s1}$ of the low-pass filter 30 is measured at the first output $S_1$ of the integrator 31.

The first 32 and second 33 impedances of the low-pass filter 30A according to one embodiment of the disclosure are resistors of respective values $Z_1 = R_1$ and $Z_2 = R_2$.

The transfer function $A(\omega)$ of the integrator 31 whose unity frequency $f_u$ is adjustable is expressed:

$$A(\omega) = \frac{1}{\frac{j\omega}{2\pi f_u}},$$

j being the imaginary number $\sqrt{-1}$, $f_u$ being the unity frequency of the integrator, and ω being the pulsing of the signal.

Thus, the transfer function $G(\omega)$ of the low-pass filter 30A represented in FIG. 3 is expressed:

$$\frac{V_{s1}}{V_{e1}} = G(\omega) = \frac{R_2}{R_1} \times \frac{1}{1 + \frac{j\omega}{2\pi f_u} \times \frac{R_1 + R_2}{R_1}}.$$

The cut-off frequency $f_c$ of the low-pass filter 30' represented in FIG. 3 consequently has the following value:

$$f_c = f_u \frac{R_1}{R_1 + R_2}.$$

Advantageously, the cut-off frequency fc of the low-pass filter 30A represented in FIG. 3 can be adjusted by adjusting the unity frequency fu of the integrator 31.

The values of the first 32 and second 33 resistors $R_1$ and $R_2$ are chosen such that the ratio $$\frac{R_2}{R_1}$$

is greater than or equal to 0.5 and less than or equal to 5, preferably less than or equal to 2.

In these conditions, the frequencies are approximately ten times lower than the unity frequency fu of the integrator 31, the transfer function of the low-pass filter 30A represented in FIG. 3 can be expressed:

$$G \approx \frac{R_2}{R_1}.$$

Thus, the gain G of the low-pass filter 30A is approximately equal to the ratio $$\frac{R_2}{R_1}$$

at said frequencies. The inventors have observed that it is preferable to keep the ratio $$\frac{R_2}{R_1}$$

less than or equal to 5, preferably less than or equal to 2, in order to provide a good linearity for the low-pass filter 30A.

In practice, the resistors $R_1$ and $R_2$ are chosen so as to exhibit values of a few kΩ.

Figure 4:
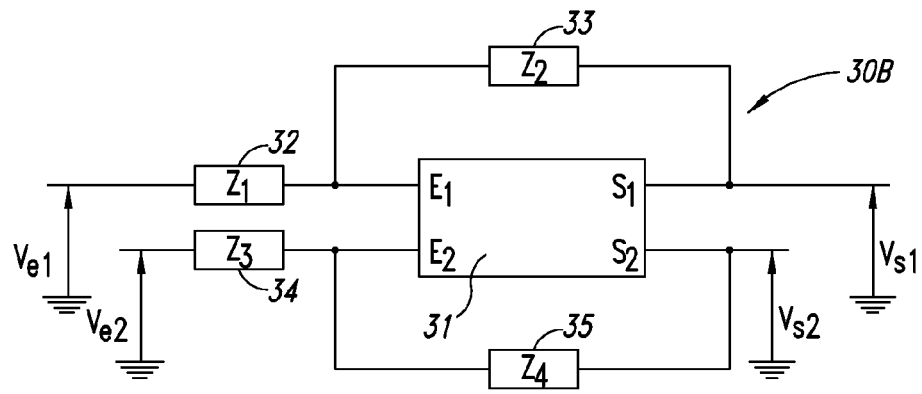
FIG. 4 represents a low-pass filter according to a second embodiment of the disclosure.

FIG. 4 represents a first order low-pass filter according to a second embodiment of the disclosure. The low-pass filter 30B represented in FIG. 4 comprises an integrator 31 whose unity frequency fu is adjustable, first 32, denoted $Z_1$, second 33, denoted $Z_2$, third 34, denoted $Z_3$ and fourth 35, denoted $Z_4$, impedances.

Said integrator 31 comprises first $E_1$ and second $E_2$ inputs, first $S_1$ and second $S_2$ outputs and a first, respectively second, feedback loop between the first output $S_1$ and the first input $E_1$, respectively between the second output $S_2$ and the second input $E_2$.

The first input $E_1$ of the integrator 31 is connected to a branch comprising the first impedance 32 to which is applied a first input voltage $V_{e1}$ of the low-pass filter 30B. The first feedback loop comprises the second impedance 33. A first output voltage $V_{s1}$ of the low-pass filter 30B is measured at the first output $S_1$ of the integrator 31.

The second input $E_2$ of the integrator 31 is connected to a branch comprising the third impedance 34 to which is applied a second input voltage $V_{e2}$ of the low-pass filter 30B. The second feedback loop comprises the fourth impedance 35. A second output voltage $V_{s2}$ of the low-pass filter 30B is measured at the second output $S_2$ of the integrator 31.

The impedances (32, 33, 34, 35) of the low-pass filter 30B may be resistors of respective values $Z_1 = R_1$, $Z_2 = R_2$, $Z_3 = R_3$, $Z_4 = R_4$.

The values of the resistors $R_1$, $R_2$, $R_3$ and $R_4$ are chosen such that the ratios $$\frac{R_2}{R_1} \text{ and } \frac{R_4}{R_3}$$

are each greater than or equal to 0.5 and less than or equal to 5, preferably less than or equal to 2.

In practice, the resistors $R_1$, $R_2$, $R_3$ and $R_4$ are chosen so as to exhibit values of a few kΩ.

Figure 5:
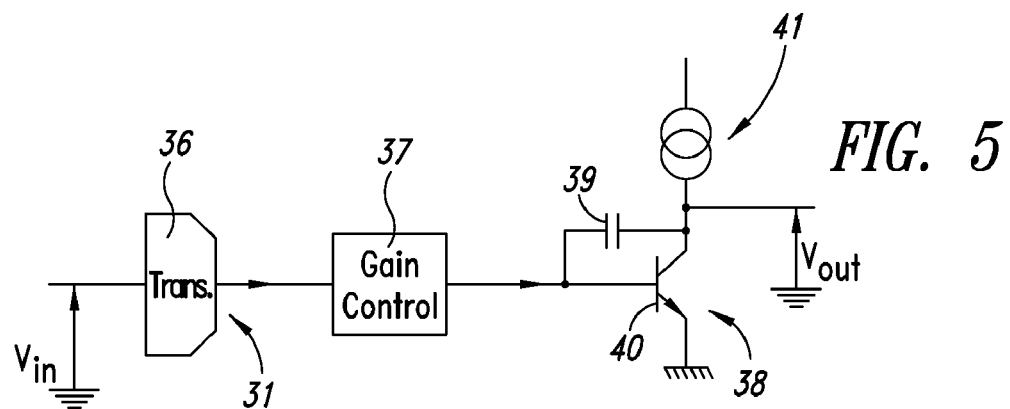
FIG. 5 represents a possible block diagram of an integrator whose unity frequency fu is adjustable that can be used in a low-pass filter according to the disclosure.

FIG. 5 represents an example of a block diagram of the integrator 31 whose unity frequency is adjustable that can be used in a low-pass filter according to the disclosure, for example for the low-pass filter 30A as represented in FIG. 3.

The integrator whose unity frequency is adjustable represented in FIG. 5 comprises three stages:

an input stage comprising a transconductor 36;

a variable gain control stage 37; and an output stage 38 comprising a capacitor 39, a bipolar transistor 40 and a current source 41.

The transconductor 36, the transconductance value of which is gm, is used to transform the input voltage $V_{in}$ of the integrator 31 into a current $i_1 = gm \times V_{in}$.

The variable gain control stage 37 is used to multiply the output current $i_1$ of the transconductor 36 by a gain coefficient α, and delivers a current $i_2 = \alpha \times i_1$ to the output stage 38.

The emitter of the bipolar transistor 40 of the output stage 38 is directly linked to ground. Said bipolar transistor 40 has a loop between its collector and its base, said loop comprising the capacitor 39 of value C. The collector of the bipolar transistor 40 is also linked to the current source 41.

The output voltage $V_{out}$ of the integrator 31 is measured between ground and the collector of the bipolar transistor 40.

The output stage 38 is used to transform the output current $i_2$ from the variable gain control stage 37 into an output voltage $V_{out}$.

The unity frequency fu of an integrator 31 having a block diagram as represented in FIG. 5 can be expressed:

$$fu = \frac{gm \times \alpha}{2\pi C}.$$

The unity frequency fu of the integrator 31 can therefore easily be adjusted, in particular by adjusting the gain α of the variable gain control stage 37.

Advantageously, the variable gain control stage 37 is used to adjust the unity frequency of the integrator while ensuring a good linearity over the entire frequency range.

According to one embodiment of the disclosure, the integrator 31 whose unity frequency is adjustable included in the low-pass filter according to the disclosure comprises, between an input stage and an output stage, a variable gain control stage 37 whose gain α varies from a value $\alpha_{min}$ to a value $\alpha_{max}$ with the ratio $$\frac{\alpha_{max}}{\alpha_{min}}$$

greater than or equal to 1 and less than or equal to 25.

The integrator whose unity frequency is adjustable may comprise differential inputs and outputs and bipolar-type transistors according to schemes well known to those skilled in the art.

However, it is also possible to envisage solutions with non-differential outputs and/or MOS-type transistors, in particular the bipolar transistor 40 of the integrator whose unity frequency is adjustable represented in FIG. 5 may be replaced by an MOS-type transistor. The gain control command is used, for example by applying a variable voltage between its two branches, to adjust the gain α of the variable gain control stage, and thus to adjust the unity frequency $f_u$ of the integrator 31 in order to adapt the cut-off frequency $f_c$ of a low-pass filter 30A, B according to the disclosure.

The disclosure also relates to low-pass filters of an order greater than or equal to two comprising at least one first order low-pass filter according to the disclosure. Conventional assemblies of low-pass filters of an order greater than or equal to two may be adapted to the use of a first order low-pass filter according to the disclosure.

Figure 6:
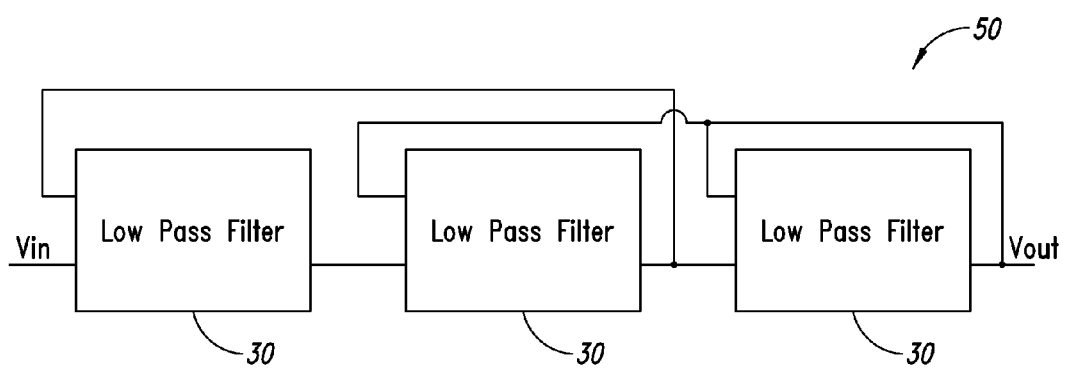
FIG. 6 is a block diagram of a third-order filter that includes three filter stages in a leapfrog configuration.

One embodiment of the present disclosure a third order low-pass filter 50 having a leapfrog cascade structure, as shown in FIG. 6. The third order low-pass filter 50 includes three low-pass filters 30 connected in a leapfrog structure according to the disclosure. At least one, and preferably all, of the low-pass filters 30 is one of the low-pass filters of the present disclosure, such as the filters 30A, 30B shown in FIGS. 3-4, although other low-pass filters could be employed in addition to one of the low-pass filters according to the present disclosure.

In the leapfrog structure of the filter 50 of FIG. 6, a first filter 30 receives an input signal Vin at a first input and is fed back the output of the second filter 30 at a second input. Similarly, the second filter 30 receives the output of the first filter 30 at a first input and is fed back the output of the third filter 30 at a second input. The third filter 30 receives the output of the second filter 30 at a first input and is fed back the output of the third filter 30 at a second input. The output of the third filter provides a filter output signal Vout.

The frequency response of such a third order low-pass filter is controlled by separately adjusting the unity frequency of each of the three integrators of the filters 30, whose unity frequency is adjustable. As an example, a "Butterworth" type third order low-pass filter of cut-off frequency fc is obtained if:

$f_{u,1}=2.667 \times fc$, $f_{u,2}=1.125 \times fc$, and $f_{u,3}=2.667 \times fc$, with $f_{u,1}$, $f_{u,2}$ and $f_{u,3}$ being the unity frequencies of the integrators included in the first, second and third low-pass filters.

The disclosure is not limited to the embodiments or examples described and should be interpreted in a non-limiting manner, encompassing any equivalent embodiment or example.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A low-pass filter, comprising:
    a first input terminal configured to receive a first input voltage;
    a first impedance coupled to the first input terminal;
    an output terminal; and
    an integrator having an adjustable unity frequency, said integrator including:
        a first input coupled to the first impedance such that the first impedance is positioned between the first input terminal and the first input of the integrator;
        a first output coupled to the output terminal of the low-pass filter;
        an input stage coupled to the first input and including a transconductor;
        an output stage coupled to the output terminal;
        a variable gain control stage electrically coupled between an output of the transconductor and an input of the output stage and configured to adjust the unity frequency of the integrator; and
        a feedback loop between said first input and first output of said integrator, said feedback loop including a second impedance.

2. A low-pass filter according to claim 1, wherein the variable gain control stage is configured to allow the unity frequency of said integrator to be adjusted.

3. A low-pass filter according to claim 2, wherein the variable gain control stage has a gain that is variable from a value $\alpha_{min}$ to a value $\alpha_{max}$, with $1 \leq \alpha_{max}/\alpha_{min} \leq 25$.

4. A low-pass filter according to claim 1, wherein the integrator comprises a second input and a second output, said second input and second output being coupled to ground.

5. A low-pass filter according to claim 1, further comprising:
    a second input terminal configured to receive a second input voltage;
    a second output terminal; and
    a third impedance coupled to the second input terminal, wherein the integrator comprises:
        a second input coupled to the third impedance such that the third impedance is positioned between the second input terminal and the second input of the integrator;
        a second output, coupled to the second output terminal of the low-pass filter; and
        a second feedback loop between said second input and output of said integrator, said second feedback loop including a fourth impedance.

6. A low-pass filter according to claim 1, wherein the first and second impedances are chosen such that $0.5 \leq Z_2/Z_1 \leq 5$, with $Z_1$ and $Z_2$ being values of the first and second impedances, respectively.

7. A low-pass filter according to claim 1, wherein the low-pass filter is of an order greater than or equal to 2.

8. A low-pass filter according to claim 1, wherein the low-pass filter has a leapfrog cascade structure of plural low-pass filter circuits, wherein one of the low-pass filter circuits includes a first impedance and the integrator.

9. A system for processing an electrical signal comprising:
    a first low-pass filter stage that includes:
        a first input terminal configured to receive a first input voltage;

a first impedance coupled to the first input terminal;
a first output terminal configured to provide a first output signal; and
a first integrator having an adjustable unity frequency, said integrator including:
   a first input coupled to the first impedance such that the first impedance is positioned between the first input terminal and the first input of the integrator;
   a first output coupled to the first output terminal of the first low-pass filter stage;
   an input stage coupled to the first input and including a transconductor;
   an output stage coupled to the output terminal;
   a variable gain control stage electrically coupled between an output of the transconductor and an input of the output stage and configured to adjust the unity frequency of the integrator; and
   a first feedback loop between said first input and first output of said integrator, said first feedback loop including a second impedance.

10. A system according to claim 9, comprising:
a second low-pass filter stage coupled to the first low-pass filter stage in a leapfrog configuration.

11. A system according to claim 10, wherein the first low-pass filter stage includes a second input terminal and the second low-pass filter stage includes:
a third input terminal configured to receive the first output signal;
a third impedance coupled to the third input terminal;
a second output terminal configured to provide a second output signal; and
a second integrator having an adjustable unity frequency, said second integrator including:
   a first input coupled to the third impedance such that the third impedance is positioned between the third input terminal and the first input of the second integrator;
   a first output coupled to the second output terminal of the second low-pass filter stage; and
   a second feedback loop between said first input and first output of said integrator, said second feedback loop including a fourth impedance.

12. A system according to claim 9, wherein the variable gain control stage is configured to adjust the unity frequency of said first integrator.

13. A system according to claim 12, wherein the variable gain control stage has a gain that is variable from a value $\alpha_{min}$ to a value $\alpha_{max}$, with $1 \leq \alpha_{max}/\alpha_{min} \leq 25$.

14. A system according to claim 9, wherein the first integrator comprises a second input and a second output, said second input and second output being coupled to ground.

15. A system according to claim 9, further comprising:
a second input terminal configured to receive a second input voltage;
a second output terminal; and
a third impedance coupled to the second input terminal, wherein the integrator comprises:
   a second input coupled to the third impedance such that the third impedance is positioned between the second input terminal and the second input of the integrator;
   a second output, coupled to the second output terminal of the low-pass filter; and
   a second feedback loop between said second input and output of said integrator, said second feedback loop including a fourth impedance.

16. A system according to claim 9, wherein the first and second impedances are chosen such that $0.5 \leq Z_2/Z_1 \leq 5$, with $Z_1$ and $Z_2$ being values of the first and second impedances, respectively.

17. A system according to claim 9, wherein the low-pass filter is of an order greater than or equal to 2.

* * * * *